United States Patent
Nagao et al.

(10) Patent No.: US 9,243,778 B2
(45) Date of Patent: Jan. 26, 2016

(54) WAVELENGTH CONVERSION ELEMENT, LIGHT EMITTING DEVICE INCLUDING WAVELENGTH CONVERSION ELEMENT, AND VEHICLE INCLUDING LIGHT EMITTING DEVICE

(71) Applicant: PANASONIC CORPORATION, Osaka (JP)

(72) Inventors: Nobuaki Nagao, Gifu (JP); Takahiro Hamada, Osaka (JP); Nobuyasu Suzuki, Osaka (JP); Seigo Shiraishi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/277,377

(22) Filed: May 14, 2014

(65) Prior Publication Data
US 2014/0353702 A1    Dec. 4, 2014

(30) Foreign Application Priority Data
May 31, 2013   (JP) .................................. 2013-115866

(51) Int. Cl.
*H01L 33/00*   (2010.01)
*F21V 9/16*    (2006.01)
*H01L 33/50*   (2010.01)
(Continued)

(52) U.S. Cl.
CPC . *F21V 9/16* (2013.01); *C09K 11/02* (2013.01); *F21S 48/1145* (2013.01); *H01L 33/507* (2013.01); *F21S 48/1195* (2013.01); *G02B 1/005* (2013.01); *H01L 33/58* (2013.01)

(58) Field of Classification Search
CPC .......... H01L 33/60; H01L 33/20; F21V 11/00
USPC .............................................. 257/98; 362/317
See application file for complete search history.

(56) References Cited

U.S. PATENT DOCUMENTS 7,910,942 B2 *   3/2011   Yoon ................................. 257/98
2009/0026475 A1   1/2009   Yamaguchi et al.
(Continued)

FOREIGN PATENT DOCUMENTS

JP   2005-039264 A   2/2005
JP   2005-191326 A   7/2005
(Continued)

OTHER PUBLICATIONS

Nakamura, S., et al.: "Superbright Green InGaN Single-Quantum-Well-Structure Light-Emitting Diodes", Japanese Journal of Applied Physics, vol. 34, 1995, Part 2, No. 10B, pp. L1332-L1335.

*Primary Examiner* — Fernando L Toledo
*Assistant Examiner* — Neil Prasad
(74) *Attorney, Agent, or Firm* — McDermott Will & Emery LLP

(57) ABSTRACT

A wavelength conversion element includes a phosphor layer including phosphor particles configured to be excited by light from a light source and a matrix located among the phosphor particles; and a column-shaped structural body including at least two kinds of column-shaped bodies periodically arranged and in contact with the phosphor layer. The column-shaped bodies have different heights and/or different thicknesses. The column-shaped structural body is a photonic crystal.

23 Claims, 10 Drawing Sheets

(51) Int. Cl.
*F21S 8/10* (2006.01)
*C09K 11/02* (2006.01)
*G02B 1/00* (2006.01)
*H01L 33/58* (2010.01)

(56) References Cited

U.S. PATENT DOCUMENTS

| | | |
|---|---|---|
| 2009/0267048 A1 | 10/2009 | Nakahara |
| 2010/0320450 A1 | 12/2010 | Fujioka |
| 2011/0108867 A1* | 5/2011 | Youn ............................... 257/98 |
| 2011/0133208 A1 | 6/2011 | Nakahara |
| 2011/0266518 A1* | 11/2011 | Kim ................................. 257/13 |
| 2012/0294025 A1* | 11/2012 | Kim et al. ...................... 362/516 |

FOREIGN PATENT DOCUMENTS

| | | |
|---|---|---|
| JP | 2006-179618 A | 7/2006 |
| JP | 2007-019488 A | 1/2007 |
| JP | 2007-184313 A | 7/2007 |
| JP | 2007-314386 A | 12/2007 |
| JP | 2009-200207 A | 9/2009 |

* cited by examiner

↑ Normal Line Direction

WAVELENGTH CONVERSION ELEMENT, LIGHT EMITTING DEVICE INCLUDING WAVELENGTH CONVERSION ELEMENT, AND VEHICLE INCLUDING LIGHT EMITTING DEVICE

This application claims priority of Japanese Patent Application No. 2013-115866, filed on May 31, 2013, the contents of which are hereby incorporated by reference.

BACKGROUND

1. Technical Field

The present application relates to a wavelength conversion element including a phosphor layer, a light emitting device including the wavelength conversion element, and a vehicle including the light emitting device.

2. Description of the Related Art

A light emitting diode (hereinafter called "LED") comprising semiconductor made of aluminum nitride (AlN), gallium nitride (GaN), indium nitride (InN) and mixed crystal thereof can emit light in a broad wavelength range from ultraviolet to infrared by adjusting the components of the semiconductor.

For example, a non-patent document (Shuji Nakamura et. al., Jpn. J. Appl. Phys. Vol. 34 (1995) L. 1332-L. 1335) discloses an LED element on the market, which emits visible light.

Patent documents (Japanese Patent Application Laid-open Publication Nos. 2009-200207, 2006-179618 (in particular, paragraph 0020), and 2005-191326 (in particular, paragraph 0056)) disclose LED elements that emit light in a blue wavelength region.

This kind of an LED element emits white light by mixing blue light from the LED element and yellow light from a wavelength conversion element that is excited by the blue light and emits the yellow light. For example, a patent document (Japanese Patent Application Laid-open Publication No. 2005-039264 (in particular, paragraph 0080)) discloses a white light emitting device of so-called remote phosphor type including a wavelength conversion element and an LED element. The wavelength conversion element comprises phosphor particles and transparent resin, and is located apart from the LED element.

SUMMARY

It is desirable for the conventional wavelength conversion elements to have improved wavelength conversion efficiency or light emission efficiency. A non-limiting and exemplary embodiment of the present application provides a wavelength conversion element having improved wavelength conversion efficiency or light emission efficiency, and a light emitting device using the same.

A wavelength conversion element of one embodiment of the present invention includes: a phosphor layer including phosphor particles configured to be excited by light from a light source and a matrix located among the phosphor particles; and a column-shaped structural body including at least two kinds of column-shaped bodies that are periodically arranged and in contact with the phosphor layer. The column-shaped bodies have at least different heights or different thicknesses. The column-shaped structural body is a photonic crystal. It should be noted that general or specific embodiments may be implemented as a device, a system, a method, or any elective combination thereof.

A wavelength conversion element disclosed in the present application allows wavelength conversion efficiency or light emission efficiency to be improved. Additional benefits and advantages of the disclosed embodiments will be apparent from the specification and Figures. The benefits and/or advantages may be individually provided by the various embodiments and features of the specification and Figures, and need not all be provided in order to obtain one or more of the same.

DETAILED DESCRIPTION

Figure 1A:
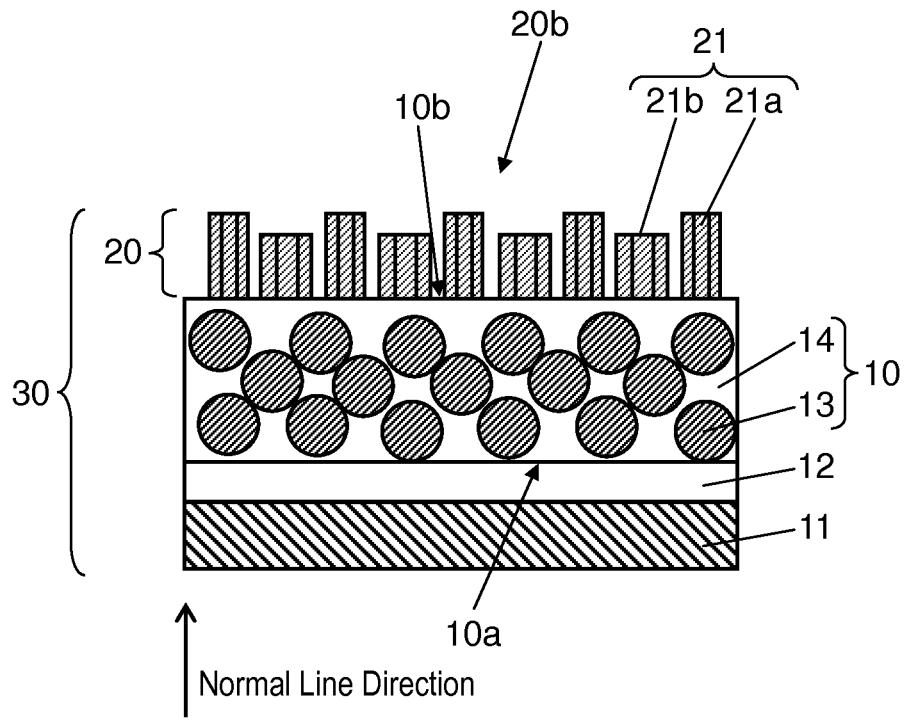
FIG. 1A shows a cross-sectional view of a wavelength conversion element of Embodiment 1.

An embodiment of a wavelength conversion element, a light emitting device and a vehicle of the present disclosure will be described below.

A wavelength conversion element of an embodiment of the present disclosure comprises the following structural elements:

a phosphor layer including phosphor particles configured to be excited by light from a light source and a matrix located among the phosphor particles; and a column-shaped structural body including at least two kinds of column-shaped bodies that are periodically arranged and in contact with the phosphor layer.

The column-shaped bodies may have at least different heights or different thicknesses.

The column-shaped structural body can be a photonic crystal. A distance between center axes of adjacent two column-shaped bodies may be equal to or longer than a shortest wavelength of an incident light from the phosphor layer to the column-shaped structural body, and equal to or shorter than a longest wavelength of the incident light from the phosphor layer to the column-shaped structural body. A distance between center axes of adjacent two column-shaped bodies may be equal to or more than 420 nm, and equal to or less than 750 nm. Heights of the column-shaped bodies may be equal to or shorter than a longest wavelength of an incident light from the phosphor layer to the column-shaped structural body. Diameters of circles circumscribing cross-sectional shapes of the column-shaped bodies may be equal to or more than 0.25 µm, and equal to or less than 0.9 µm. The cross-sectional shapes are vertical to a longitudinal direction of the column-shaped bodies.

The column-shaped bodies may include first column-shaped bodies having a first thickness and second column-shaped bodies having a second thickness that is thicker than the first thickness.

The first column-shaped bodies may be taller than the second column-shaped bodies.

A height difference between the first column-shaped bodies and the second column-shaped bodies may be equal to or more than 50 nm, and equal to or less than 150 nm. A height of the first column-shaped bodies may be equal to or more than 150 nm, and equal to or less than 750 nm. A height of the second column-shaped bodies may be equal to or more than 50 nm, and equal to or less than 650 nm. A diameter of circles circumscribing cross-sectional shapes of the first column-shaped bodies may be equal to or more than 0.25 µm, and equal to or less than 0.35 µm. A diameter of circles circumscribing cross-sectional shapes of the second column-shaped bodies may be equal to or more than 0.5 µm, and equal to or less than 0.9 µm. The cross-sectional shapes of the first and second column-shaped bodies are vertical to a longitudinal direction of the column-shaped bodies.

The column-shaped bodies may be hexagonal columns.

The column-shaped bodies may be located at vertexes of triangles on a plane, and the first column-shaped bodies and the second column-shaped bodies may be arranged alternately with each other.

The column-shaped bodies can be periodically disposed at intervals equal to or more than 400 nm, and equal to or less than 900 nm. The column-shaped bodies can be periodically disposed at intervals equal to or more than 400 nm, and equal to or less than 800 nm.

The column-shaped bodies may include at least one selected from a group of ceramics, inorganic crystal, resin and glass that are transparent at least in a visible light region.

The column-shaped bodies may be made of a zinc oxide crystal.

An average of light extraction efficiency in a wavelength band from 400 nm to 750 nm both inclusive may be higher than light extraction efficiency in other wavelength bands when light enters from the phosphor layer and exits from the column-shaped structural body.

An average of light extraction efficiency in a wavelength band from 420 nm to 650 nm both inclusive may be higher than light extraction efficiency in other wavelength bands when light enters from the phosphor layer and exits from the column-shaped structural body.

The matrix may be formed of zinc oxide that is crystallized and c-axis oriented.

A longitudinal direction of the column-shaped bodies may be parallel to the c-axis of the zinc oxide that forms the matrix.

The phosphor particles may include at least one selected from a group of YAG (yttrium aluminum garnet) phosphor and β-SiAlON phosphor.

A light emitting device may comprise the following structural elements:
the light source configured to emit an excitation light; and
the wavelength conversion element configured to receive the excitation light emitted from the light source.

The light source may be an LED or a laser diode.

The excitation light may have a wavelength within a band from blue to violet.

A vehicle of an embodiment of the present disclosure may comprise the light emitting device, and a power source configured to supply power to the light emitting device.

A manufacturing method of a wavelength conversion element according to an embodiment of the present disclosure may include following steps:
forming a phosphor particle layer including phosphor particles on a thin film of c-axis oriented zinc oxide;
filling voids in the phosphor particle layer with zinc oxide by using a chemical bath deposition method (or solution growth method) to form a phosphor layer;
forming a resist pattern having at least two kinds of a plurality of openings that have different sizes on the phosphor layer; and
growing column-shaped bodies from the openings by using the chemical bath deposition method to form the column-shaped structural body including at least two kinds of column-shaped bodies that have different heights and different thicknesses.

The openings may include first openings and second openings. A diameter of inscribed circles of the first openings may be equal to or more than 0.25 µm, and equal to or less than 0.35 µm. A diameter of inscribed circles of the second openings may be equal to or more than 0.5 µm, and equal to or less than 0.9 µm.

Each of the first and second openings may have a circle shape. Each of the column-shaped bodies may be a hexagonal column.

The thin film may be formed on a substrate that includes a hexagonal crystal based single crystal.

The substrate may be made of a single crystal of sapphire, gallium nitride or zinc oxide.

Hereinafter, embodiments of the present disclosure will be described with reference to the accompanying drawings.

Embodiment 1

FIG. 1A shows a cross-sectional view of a wavelength conversion element of Embodiment 1.

Wavelength conversion element 30 of the embodiment comprises phosphor layer 10 and column-shaped structural body 20. Wavelength conversion element 30 may convert at least a part of incident light into light having a wavelength band different from that of the incident light to emit the converted light.

Phosphor layer 10 may include phosphor particles 13 and matrix 14 located among phosphor particles 13.

Phosphor particles 13 can employ phosphors having various excitation wavelengths, light-emission wavelengths and particle sizes that are generally used for light-emitting elements. Phosphor particles 13 can be YAG (yttrium aluminum garnet) or β-SiAlON. A wavelength of light to excite phosphor particles 13 and a wavelength of light to be emitted from phosphor particles 13 can be selected depending on applications of wavelength conversion element 30. Doping elements in YAG or β-SiAlON can be selected depending on those wavelengths.

In the case that violet or blue light is selected among others as an excitation light to excite phosphor layer 10, phosphors are efficiently excited. Thus, it is possible to obtain light emitting elements or light emitting devices (e.g. semiconductor laser light emitting devices or LED elements) having improved output capability.

Violet light emitted from the light emitting element may excite blue phosphors, so that blue light generated by the blue phosphors excites phosphor particles 13 of wavelength conversion element 30. Thus, blue light entering into wavelength conversion element 30 may include the blue light generated by blue phosphors.

In the case that phosphor particles 13 are yellow phosphors capable of being excited by blue light, wavelength conversion element 30 emits white light formed by synthesizing the blue light as the excitation light and the yellow light from the yellow phosphors. Note that in this disclosure, it is defined that light having a wavelength in a region from 400 nm to 420 nm is violet light; light having a wavelength in a region from 420 nm to 470 nm is blue light; light having a wavelength in a region from 500 nm to 700 nm is yellow light; a blue phosphor is a phosphor capable of being excited by violet light and emitting blue light; and a yellow phosphor is a phosphor capable of being excited by blue or violet light and emitting yellow light.

Phosphor particles 13 may employ blue phosphors capable of being excited by violet light and yellow phosphors capable of being excited by blue light. In this case, wavelength conversion element 30 also emits white light formed by synthesizing the blue light and yellow light from the phosphors. Alternatively, phosphor particles 13 may employ blue phosphors capable of being excited by violet light and yellow phosphors capable of being excited by violet light. In this case, wavelength conversion element 30 also emits white light formed by synthesizing the blue light and yellow light from the phosphors.

Further, phosphors capable of emitting green light or phosphors capable of emitting red light may be used with the blue or yellow phosphors in order to enhance color rendering properties of LED elements or semiconductor laser light emitting devices.

Matrix 14 may be made of c-axis oriented zinc oxide (ZnO). To be more specific, the c-axis oriented zinc oxide may be columnar crystals or a single crystal having wurtzite structure. C-axis oriented columnar crystals include few crystal grain boundaries in a c-axis direction. C-axis of zinc oxide that constructs matrix 14 may be parallel to a normal line direction (indicated by an allow in FIG. 1A) of main surface 10a or 10b of phosphor layer 10, or inclined less than four degrees from the normal line direction of main surface 10a or 10b. In the present disclosure, "c-axis is inclined less than four degrees" means that distribution of c-axis inclinations is less than four degrees. Inclinations of all crystallites are not necessarily less than four degrees. "Inclination of c-axis" can be evaluated by using a half-value width of distribution of c-axis inclinations measured by X-ray rocking curve method.

In phosphor layer 10, phosphor particles 13 may be in contact with each other. Voids among phosphor particles 13 may be filled with matrix 14, so that matrix 14 and phosphor particles 13 are in contact with each other. Therefore, adjacent particles in phosphor particles 13 are in contact with each other and also contact with matrix 14. Phosphor layer 10 includes substantially no voids.

Matrix 14 made of the c-axis oriented zinc oxide may be formed by using a crystal growth property of zinc oxide. Thus, wavelength conversion element 30 may further comprise substrate 11 and thin film 12. Thin film 12 is in contact with main surface 10b of phosphor layer 10. Substrate 11 is in contact with thin film 12, and thin film 12 is located between substrate 11 and phosphor layer 10.

Substrate 11 may be made of one selected from a group of glass, quartz, silicon oxide, sapphire, gallium nitride (GaN) and zinc oxide. In the case that substrate 11 is made of sapphire or gallium nitride, a main surface of substrate 11 may be a c-plane of a sapphire crystal or a gallium nitride crystal. Thin film 12 may be made of a single crystal zinc oxide or polycrystalline zinc oxide.

In this case, thin film 12 functions as a seed crystal that is to be a nucleus for crystal growth of zinc oxide that constructs matrix 14, so that matrix 14 can be formed of the c-axis oriented zinc oxide.

Substrate 11 and thin film 12 may be removed after matrix 14 has been formed. Thus, wavelength conversion element 30 may not include substrate 11 and/or thin film 12. In the case that the c-axis oriented zinc oxide can be formed directly on substrate 11, wavelength conversion element 30 may include substrate 11 while not including thin film 12.

Column-shaped structural body 20 may be provided in contact with main surface 10b of phosphor layer 10. Column-shaped structural body 20 includes column-shaped bodies 21 that have at least two different heights. Column-shaped bodies 21 may include first column-shaped bodies 21a and second column-shaped bodies 21b. As shown in FIG. 1A, first column-shaped bodies 21a may be taller than second column-shaped bodies 21b. As described later, in the case that a difference in height between first column-shaped bodies 21a and second column-shaped bodies 21b is equal to or more than 50 nm, and equal to or less than 150 nm, light extraction efficiency is improved in a broad wavelength band. Furthermore, in the case that a height of second column-shaped bodies 21b is more than 50 nm, the light extraction efficiency is significantly improved.

Each of column-shaped bodies 21 may have a column shape extending in a direction of a normal line of main surface 10b as shown in FIG. 1A with an arrow. In other words, a direction in which the column shape extends may be parallel to or inclined less than four degrees with respect to c-axis of zinc oxide that constructs matrix 14.

Figure 1B:
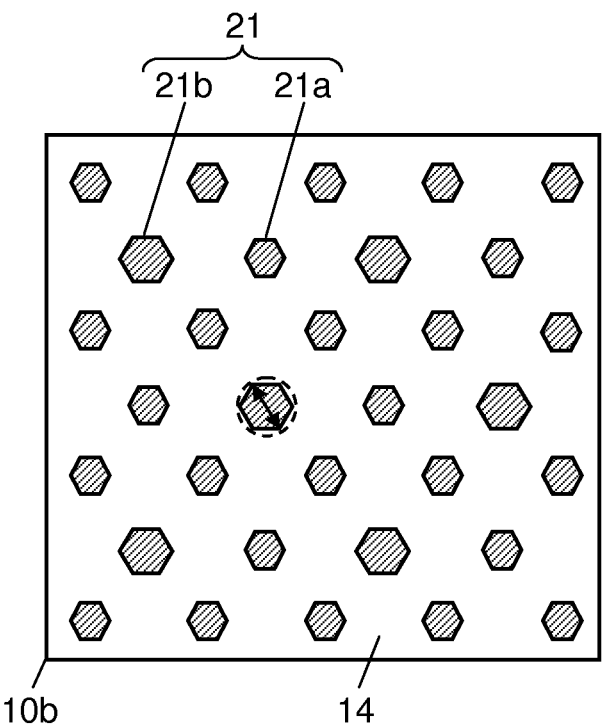
FIG. 1B shows a top view of a wavelength conversion element of Embodiment 1.

FIG. 1B shows an arrangement of column-shaped bodies 21 on main surface 10b. Column-shaped bodies 21 may be arranged two dimensionally and periodically at given intervals on main surface 10b. According to the embodiment, column-shaped bodies 21 may be arranged so that three adjacent column-shaped bodies 21 are located respectively at vertexes of a triangle on main surface 10b. To be more specific, the triangle may be an equilateral triangle. First column-shaped bodies 21a and second column-shaped bodies 21b may be arranged alternately to each other. In main surface 10b, an arrangement interval between column-shaped bodies 21 may be equal to or more than 400 nm, and equal to or less than 900 nm. In the present disclosure, the "arrangement interval" means a distance between centers of respective column-shaped bodies on a plane. Column-shaped bodies 21 may be arranged at vertexes of quadrangles or other shapes instead of triangles.

According to the embodiment, cross-sectional shapes of first column-shaped bodies 21a and second column-shaped bodies 21b may be hexagons. The cross-sectional shapes are vertical to longitudinal directions of first column-shaped bodies 21a and second column-shaped bodies 21b. As shown in FIG. 1B, first column-shaped bodies 21*b* may be thicker than second column-shaped bodies 21*a*. Column-shaped structural body 20 may include two kinds of column-shaped bodies 21 that are periodically arranged and have the same height while having different thicknesses. In the present disclosure, a thickness of a column-shaped body is defined as a diameter (e.g. shown by an arrow in FIG. 1B) of a circle (e.g. shown by a broken line) circumscribing a cross-sectional shape of the column-shaped body, the cross-sectional shape being vertical to a longitudinal direction of the column-shaped body.

As described later, according to the embodiment, thicknesses of first column-shaped bodies 21*a* and second column-shaped bodies 21*b* may be different from each other due to a manufacturing method. First column-shaped bodies 21*a* and second column-shaped bodies 21*b* may have different heights while having the same thickness. Furthermore, first column-shaped bodies 21*a* may be thicker than second column-shaped bodies 21*b*. The cross-sectional shapes vertical to longitudinal directions of first column-shaped bodies 21*a* and second column-shaped bodies 21*b* may be closed line-shapes (e.g. circles or ovals) or polygons (e.g. triangles or quadrangles). The cross-sectional shapes of all the column-shaped bodies 21 may be the same. However, the cross-sectional shapes of all the column-shaped bodies 21 are not necessarily the same, and some of the cross-sectional shapes may be different from the others. Upper and bottom surfaces of each of the column-shaped bodies 21 are not necessarily the same in shape and size. Thus, the column-shaped bodies 21 may include frustums.

Column-shaped bodies 21 can be made of a material that transmits light of a desirable wavelength depending on applications of wavelength conversion element 30. Column-shaped bodies 21 may be made of at least one selected from a group of ceramics, inorganic crystal, resin and glass that transmit visible light. According to the embodiment, column-shaped bodies 21 may be made of a zinc oxide crystal.

Column-shaped structural body 20 has a structure described above. Spaces between column-shaped bodies 21 may be filled with substances (e.g. air) in circumstances where wavelength conversion element 30 is used. Thus, column-shaped structural body 20 forms a photonic crystal having a fine structure in which a refractive index changes periodically. Since column-shaped structural body 20 is the photonic crystal, it is possible to improve light extraction efficiency in the case that a distance between center axes of every two adjacent column-shaped bodies 21 is equal to or longer than a shortest wavelength of an incident light from phosphor layer 10 to column-shaped structural body 20, and equal to or shorter than a longest wavelength of the incident light from phosphor layer 10 to the column-shaped structural body 20. In the present disclosure, "shortest wavelength" and "longest wavelength" mean shortest wavelength and longest wavelength of a spectrum other than spectrum components that have levels equal to or lower than a noise level. Heights of column-shaped bodies 21 may be shorter than a longest wavelength of an incident light from the phosphor layer 10 to the column-shaped structural body 20. In the case that heights of first column-shaped bodies 21*a* and second column-shaped bodies 21*b* are different from each other, the photonic crystal has two different structures with regard to light passing through structural body 20 in a direction of a normal line of main surface 10*b*.

In wavelength conversion element 30, an excitation light that has entered from substrate 11 side into phosphor layer 10 side enters into phosphor particles 13 in phosphor layer 10 to excite phosphor particles 13, so that phosphor particles 13 emit fluorescence having a wavelength different from that of the excitation light. In the case that spaces between phosphor particles 13 are filled with matrix 14 made of zinc oxide, a heat-resisting property of phosphor layer 10 is improved. Since a refraction index of zinc oxide is relatively high, a difference between the refraction index of zinc oxide and that of phosphor particles 13 is relatively small. Therefore, scattering of the excitation light is reduced at surfaces of phosphor particles 13. Thus, the wavelength of the excitation light entered into phosphor layer 10 can be converted at a high efficiency to another one.

A part of the excitation light not entering into phosphor particles 13 and the fluorescence generated from phosphor particles 13 may be emitted from main surface 10*b* of phosphor layer 10. Blue light and yellow light may be emitted. Those lights are mixed to compose white light.

The excitation light and fluorescence emitted from main surface 10*b* of phosphor layer 10 may enter into column-shaped structural body 20. Column-shaped structural body 20 may have a photonic crystal structure including column-shaped bodies 21 extending in a light traveling direction. Thus, incident lights inclined from a normal line of main surface 10*b* are guided to upper surface 20*b* side of column-shaped structural body 20 by two dimensional diffraction effects. Therefore, the light having entered into column-shaped structural body 20 is emitted from upper surface 20*b* with improved light extraction efficiency. Moreover, as stated above, heights of first and second column-shaped bodies 21*a* and 21*b* may be different from each other. Thus, light extraction efficiency is improved in a broad wavelength band. In the case that column-shaped structural body 20 is designed so that first and second column-shaped bodies 21*a* and 21*b* have the height difference and the arrangement interval as described above, average of light extraction efficiency in a wavelength band from 400 nm to 750 nm both inclusive can be higher than light extraction efficiency in other wavelength bands. Particularly, in this case, average of light extraction efficiency in a wavelength band from 420 nm to 650 nm both inclusive can be higher than light extraction efficiency in other wavelength bands. This wavelength band includes blue and yellow wavelength bands. According to the wavelength conversion element of the embodiment, light extraction efficiency is improved in a broad range, thereby improving wavelength conversion efficiency or light emission efficiency. Light extraction efficiency and luminous efficiency are improved for white light emitting devices among others.

A manufacturing method of wavelength conversion element 30 will be described with reference to the accompanying drawings.

FIGS. 2A to 2F are cross-sectional diagrams showing a manufacturing method of a wavelength conversion element of Embodiment 1.

According to Embodiment 1, voids within phosphor particle layer 15 may be filled with matrix 14 made of zinc oxide that is a c-axis oriented single crystal. The zinc oxide may grow from thin film 12 of a single crystal zinc oxide. On phosphor particle layer 15 filled with matrix 14, column-shaped structural body 20 may be formed. Column-shaped structural body 20 may comprise column-shaped bodies 21 made of columnar crystals of zinc oxide.

Figure 2A:
FIGS. 2A to 2F are cross-sectional diagrams showing a manufacturing method of a wavelength conversion element of Embodiment 1.
Figure 2B:

As shown in FIG. 2A, firstly, substrate 11 may be prepared. Substrate 11 can be a single crystal substrate having a relatively smaller lattice mismatch ratio between crystal structures of the crystal substrate and zinc oxide. In this case, as shown in FIG. 2B, it is possible to crystal-grow zinc oxide to form thin film 12, so that crystal directions of substrate 11 and thin film 12 of zinc oxide have a certain relationship. This crystal-growth is called as epitaxial growth. Thin film 12 of epitaxially grown zinc oxide has almost uniform crystal orientation. Thus, basically, thin film 12 does not have crystal grain boundaries except where crystal defects and so forth exist. As stated above, a single crystal means a crystal that is epitaxially grown to have very few crystal grain boundaries. A sapphire substrate, a gallium nitride substrate or a zinc oxide substrate can be used as substrate 11 on which thin film 12 of a single crystal zinc oxide can grow epitaxially. Substrate 11 may comprise the abovementioned single crystal substrate and a buffer layer formed on the abovementioned single crystal substrate. The buffer layer further relaxes the lattice mismatch between crystal structures of substrate 11 and zinc oxide. Substrate 11 may be a c-plane sapphire substrate of a single crystal.

Thin film 12 of zinc oxide can be formed by using a vacuum film forming method (e.g. electron beam evaporation, reactive plasma evaporation, sputtering or pulse laser deposition). In the vacuum film forming method, film forming conditions at a time of film forming (e.g. substrate temperature and plasma density) and/or heat annealing process after film-forming can be adjusted to form thin film 12 of c-axis oriented zinc oxide.

In the case that a surface of substrate 11 is capable of being a seed crystal of zinc oxide at a time of solution growth, thin film 12 of a single crystal zinc oxide can be formed by using solution growth method. Thin film 12 of a single crystal zinc oxide may be formed on a gallium nitride thin film formed on a sapphire substrate by using solution growth method.

Figure 2C:
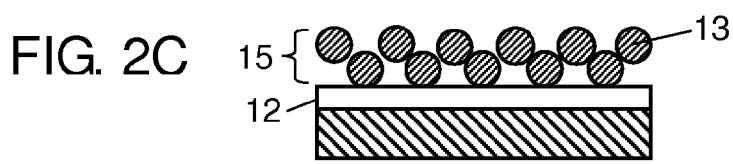
Figure 2D:
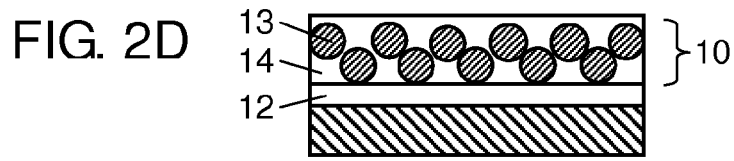

Next, as shown in FIG. 2C, phosphor particle layer 15 including phosphor particles 13 may be formed on thin film 12 of zinc oxide that has been formed on substrate 11. For example, a phosphor-dispersed solution in which phosphor particles 13 are dispersed is prepared, and phosphor particles 13 in the solution are accumulated on thin film 12 of zinc oxide by using electrophoresis. Thereby, phosphor particle layer 15 is formed. Alternatively, phosphor particles 13 in the solution may be precipitated to form phosphor particle layer 15.

Next, as shown in FIG. 2 D, c-axis oriented zinc oxide may be crystal-grown from thin film 12 of c-axis oriented zinc oxide by using a solution growth method that uses solution including Zn ions, so that voids within phosphor particle layer 15 are filled with matrix 14 made of zinc oxide. Thereby, phosphor layer 10 is formed. The solution growth method can be chemical bath deposition that is performed under the atmospheric pressure, hydrothermal synthesis that is performed under a pressure that is higher than the atmospheric pressure, or electrochemical deposition that applies electric voltage or current. The solution for the crystal growth may be zinc nitrate (Zn (NO$_3$)$_2$) solution including hexamethylenetetramine (C$_6$H$_{12}$N$_4$). A pH of the zinc nitrate solution is may be equal to or more than five and equal to or less than seven. These solution growth methods are disclosed in Japanese Patent Application Laid-open Publication No. 2004-315342.

In the case that the chemical bath deposition is performed, a solution in which 0.1 mol/l of zinc nitrate and 0.1 mol/l of hexamethylenetetramine are dissolved may be prepared. The substrate on which phosphor particle layer 15 is formed may be dipped in the prepared solution. In this case, the temperature of the solution may be kept at 90 degrees Celsius so that c-axis oriented zinc oxide is gradually crystal-grown upward from thin film 12 of c-axis oriented zinc oxide formed under the phosphor particle layer 15 while zinc oxide is not directly grown from phosphor particles 13. Thin film 12 of c-axis oriented zinc oxide acts as a seed crystal.

Figure 2E:
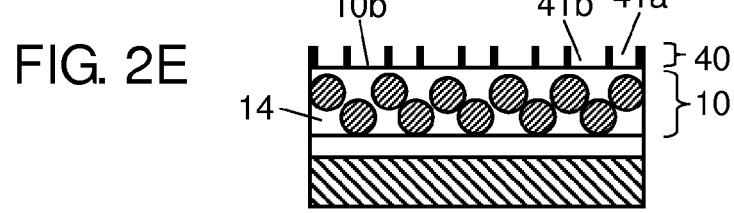

Next, as shown in FIG. 2E, resist may be applied and dried on main surface 10b of phosphor layer 10, and thereafter, periodically located first openings 41a and second openings 41b are formed in the resist by using an electron beam exposure apparatus to form resist layer 40. Shapes of first and second openings 41a and 41b in resist layer 40 may be circles. First openings 41a may be used to form first column-shaped bodies 21a. Second openings 41b may be used to form second column-shaped bodies 21b. A diameter of inscribed circles of first openings 41a may be equal to or more than 0.25 µm, and equal to or less than 0.35 µm, and a diameter of inscribed circles of second openings 41b may be equal to or more than 0.5 µm, and equal to or less than 0.9 µm. Thus, diameters of circles circumscribing cross-sectional shapes of column-shaped bodies 21 may be equal to or more than 0.25 µm, and equal to or less than 0.9 µm. Diameters of circles circumscribing cross-sectional shapes of column-shaped bodies 21a may be equal to or more than 0.25 µm, and equal to or less than 0.35 µm. Diameters of circles circumscribing cross-sectional shapes of column-shaped bodies 21b may be equal to or more than 0.5 µm, and equal to or less than 0.9 µm. Those cross-sectional shapes are vertical to a longitudinal direction of column-shaped bodies 21. Instead of resist layer 40, resin, silicon oxide film, or silicon nitride film may be used as a mask layer.

Figure 2F:
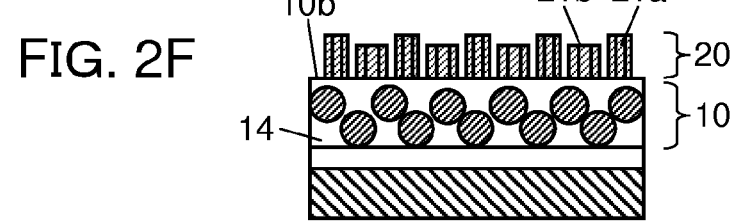

Further, as shown in FIG. 2F, first and second column-shaped bodies 21a and 21b may be formed on zinc oxide surface areas of phosphor layer 10 exposed in first and second openings 41a and 41b. First and second column-shaped bodies 21a and 21b may be formed by a chemical bath deposition method, and first and second column-shaped bodies 21a and 21b may be zinc oxide columnar crystals that are c-axis oriented.

When zinc oxide is crystal-grown by using chemical bath deposition, growing speed in a c-axis direction is faster than any other crystal axis directions. Thus, in the case that a density of Zn ions is relatively low (e.g. around 0.1 mol/l), a supply of Zn ions controls a speed of crystal growth in a c-axis direction. As a result, the larger a size of a bottom part (i.e. a size of an opening), the more Zn ions are needed, so that a crystal from a greater opening grows slower in a vertical direction than a crystal from a smaller opening.

According to the embodiment, second openings 41b are larger than first openings 41a. Thus, second column-shaped bodies 21b grown from second openings 41b are thicker and shorter than first column-shaped bodies 21a. The formed first and second column-shaped bodies 21a and 21b are c-axis oriented columnar crystals. Therefore, a cross-sectional shape vertical to a growing direction (i.e. a direction in which a column extends) is a hexagon that reflects a crystal structure. Thereby, wavelength conversion element 30 is completed.

According to the embodiment, first and second column-shaped bodies 21a and 21b may have different thicknesses due to a crystal growth property of zinc oxide when chemical bath deposition is used. First and second column-shaped bodies 21a and 21b, however, may have the same thickness or first column-shaped bodies 21a may be thicker than second column-shaped bodies 21b when column-shaped structural body 20 is formed of a material other than zinc oxide or when column-shaped structural body 20 is formed of zinc oxide by using another method. Column-shaped structural body 20 may be formed by using dry etching, electrolytic etching, nanoimprint or injection molding.

Embodiment 2

A light emitting device of an embodiment of the present disclosure will be described below.

An LED element that uses a wavelength conversion element described in Embodiment 1 will be described as a light emitting device in the embodiment.

Figure 3:
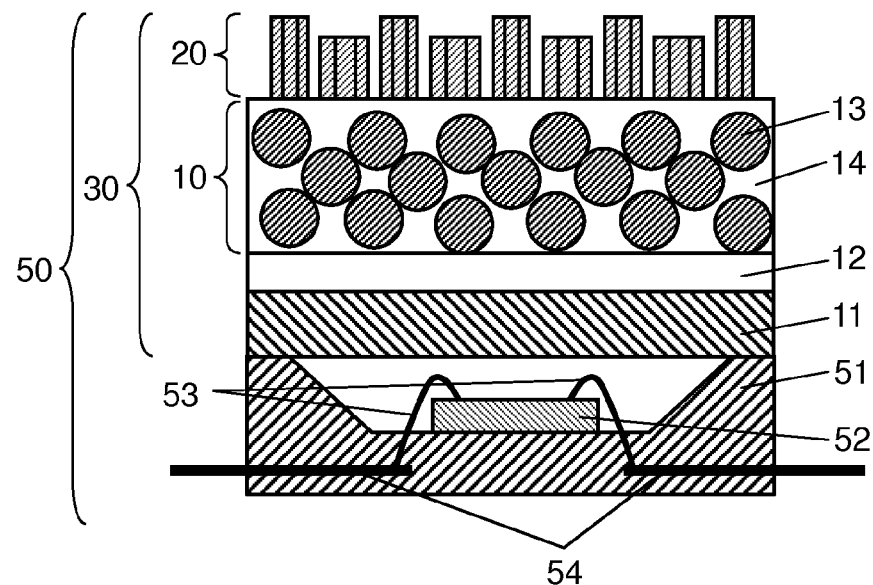
FIG. 3 shows a cross-sectional view of a light emitting device of Embodiment 2.

FIG. 3 shows a cross-sectional view of a light emitting device of Embodiment 2. In FIG. 3, electrodes of an LED chip, an internal construction of the LED chip, and so forth are simplified to be easily understood. As shown in FIG. 3, light emitting device 50 may comprise package 51, LED chip 52, and wavelength conversion element 30.

Package 51 supports LED chip 52. LED chip 52 may be a blue LED chip. LED chip 52 may be provided on package 51 so that a light emitting surface to emit light from LED chip 52 is located in upper portion of LED chip 52. Bonding wires 53 may be electrically connected to lead terminals 4 provided on package 51. LED chip 52 may be surrounded by package 51. Wavelength conversion element 30 may be fixed to package 51.

In light emitting device 50, an excitation light emitted from the light emitting surface of LED chip 52 enters into wavelength conversion element 30. A part of the excitation light that has entered into wavelength conversion element 30 may enter into phosphor layer 10 of wavelength conversion element 30, so that phosphors of phosphor layer 10 are excited to emit light having a wavelength band different from the excitation light. In the case that the phosphor is yellow phosphor, blue light as the excitation light may enter in the yellow phosphor, so that the yellow phosphor emits yellow light.

Excitation light that does not enter into phosphor particles 13 may pass through phosphor layer 10. Thus, from phosphor layer 10, blue light and yellow light may enter into column-shaped structural body 20. As described in Embodiment 1, column-shaped structural body 20 has improved light extraction efficiency in a wide wavelength band. Therefore, light emitting device 50 emits blue light and yellow light with improved light extraction efficiency, thereby improving light emission efficiency. Thus light emitting device 50 can emit white light by mixing blue light and yellow light, with high power.

Matrix 14 of phosphor layer 10 may be made of zinc oxide, which has a relatively high refraction index, an excellent heat-resisting property, and thermal conductivity that is around 10 times greater than that of silicone resin or glass. Thus, it is possible to reduce deterioration of matrix 14 for a long term.

Figure 12:
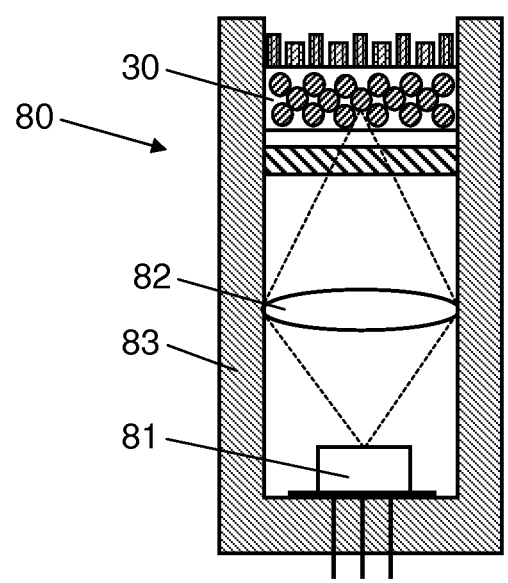
FIG. 12 shows a cross-sectional view of a light emitting device according to a modified example of Embodiment 2.

The embodiment uses LED chip 52 as a light source. Alternatively, a semiconductor laser chip including a light emitting layer of a semiconductor may be used as a light source. FIG. 12 shows a cross-sectional view of a light emitting device according to a modified example of Embodiment 2. As shown in FIG. 12, light emitting device 80 of the modified example comprises: semiconductor laser chip 81 configured to emit an excitation light; and wavelength conversion element 30 configured to receive the excitation light from semiconductor laser chip 81 to emit light. Optical system 82 may be provided between semiconductor laser chip 81 and wavelength conversion element 30. Optical system 82 may be configured to guide the excitation light, which has emitted from semiconductor laser chip 81, to wavelength conversion element 30. Light emitting device 80 may further comprise package 83 that houses semiconductor laser chip 81, wavelength conversion element 30 and optical system 82. Light emitting device 80 of this modified example operates in manner same as or similar to that of light emitting device 50 of the Embodiment 2, and provides effects same as or similar to those of emitting device 50 of the Embodiment 2. Particularly, in the case that an excitation light has higher light density than that of LED chip 52, a temperature of a part or whole of wavelength conversion element 30 may become very high. However, column-shaped bodies may be made of a zinc oxide crystal to reduce deterioration of wavelength conversion element 30 due to the high temperature.

Embodiment 3

An embodiment of a headlight and a vehicle of the present disclosure will be described below. In Embodiment 3, a headlight and a vehicle use the wavelength conversion element of Embodiment 1.

Figure 4A:
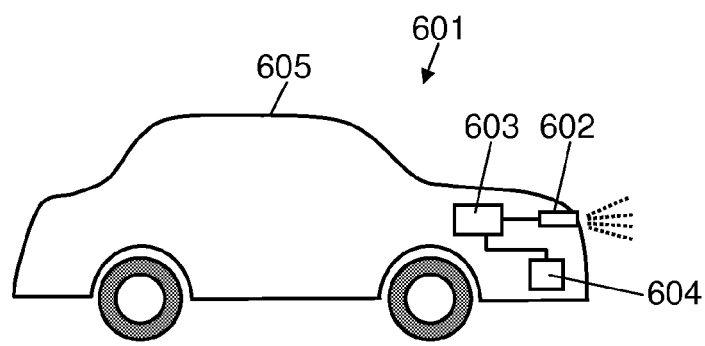
FIG. 4A shows a configuration of a vehicle of Embodiment 3.

FIG. 4A shows a configuration of a vehicle of Embodiment 3. Vehicle 601 may comprise: vehicle body 605; headlight 602 provided in a front part of vehicle body 605; electric power source 603; and power generator 604. Power generator 604 may be rotationally driven by an engine to generate electric power. The generated electric power may be stored in electric power source 603. In the embodiment, electric power source 603 may be a secondary battery that can charge and discharge electricity. In the case that vehicle 601 is an electric car or a hybrid car, power generator 604 may be an electric motor configured to drive the vehicle. Headlight 602 is capable of emitting light by using electric power from electric power source 603.

Figure 4B:
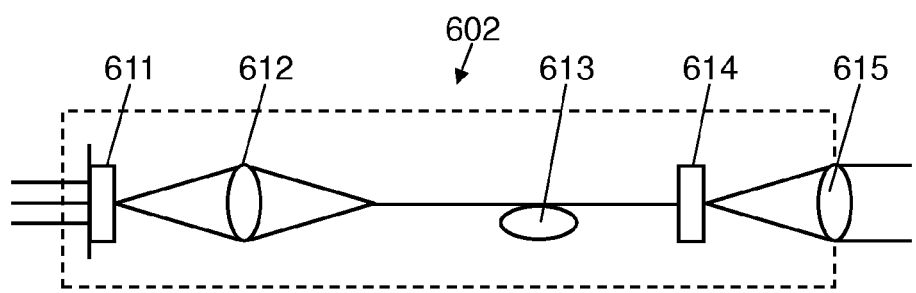
FIG. 4B shows a configuration of a headlight of Embodiment 3.

FIG. 4B shows a configuration of headlight 602 of Embodiment 3. Headlight 602 may comprise: semiconductor laser chip 611; optical system 612; optical fiber 613; wavelength conversion element 614; and optical system 615. Wavelength conversion element 614 may be wavelength conversion element 30 of Embodiment 1.

Light emitted from semiconductor laser chip 611 may be converged on a first end of optical fiber 613 so that the light passes through optical fiber 613. The light emitted from a second end of optical fiber 613 may enter into wavelength conversion element 614, so that at least a part of wavelength of the light is converted. The at least partly converted light is emitted from conversion element 614. The light emitted from conversion element 614 may be collimated by optical system 615. Thereby, headlight 602 can light a front of vehicle 601.

According to the headlight of the embodiment, a matrix that is used for a phosphor layer of a wavelength conversion element may be made of an inorganic material having high thermal conductivity and heat-resisting property. Thus, even when the headlight emits light with high intensity, the headlight has an excellent heat diffusion property, thereby reducing deterioration due to heat of the phosphor layer. Furthermore, since emission efficiency is relatively high, an electric power source consumes less electric power. Moreover, an optical fiber guides light emitted from a semiconductor laser chip to the wavelength conversion element. Therefore, the semiconductor laser chip as a heat source for the headlight can be located at a place apart from wavelength conversion element that works as another heat source, and the place may be a place where it is easy to cool down the semiconductor laser chip.

A wavelength conversion element and a light emitting device of the embodiment will be described by using the following examples.

In the present examples, optical properties of wavelength conversion elements of Embodiment 1 are calculated by using optical simulations, and the results are examined. Simulations of optical properties of column-shaped structural bodies are performed by using DiffractMod (produced by RSoft Design Group, Inc.). Wavelength dependence and incident angle dependence of transmission rates of the column-shaped structural bodies are calculated by using RCWA (Rigorous Coupled Wave Analysis) method. Optical simulations of light emitting devices are performed by using LightTools (produced by Cybernet Systems Co., Ltd.). The optical simulations are performed for an optical system including a phosphor layer and an LED chip by using a ray tracing method with consideration of excitation, absorption, light emission spectrum and Mie scattering of phosphor particles.

COMPARATIVE EXAMPLE

A white LED light emitting device of a comparative example is a remote phosphor type. In order to evaluate a light extraction of the white LED light emitting device, a simulation is performed by using RCWA method. The simulation is for studying wavelength dependence and angle dependence of transmission rates from a zinc oxide layer to an outside air layer. In the simulation, thickness of the zinc oxide layer is set to be 0.15 μm, and a light source is arranged on a normal line going through a center of a main surface of the zinc oxide layer. A refraction index of zinc oxide is set as "n=2", and a refraction index of air surrounding the zinc oxide layer is set as "n=1".

Transmission rates of light from the zinc oxide layer to an interface between the zinc oxide and air are calculated by using RCWA method. The calculation is performed for cases in which incident angles (Phi) were from 0 degree to 89 degrees. In each of the cases, a wavelength of the light is changed from 400 nm to 800 nm by 1 nm steps.

Figure 5:
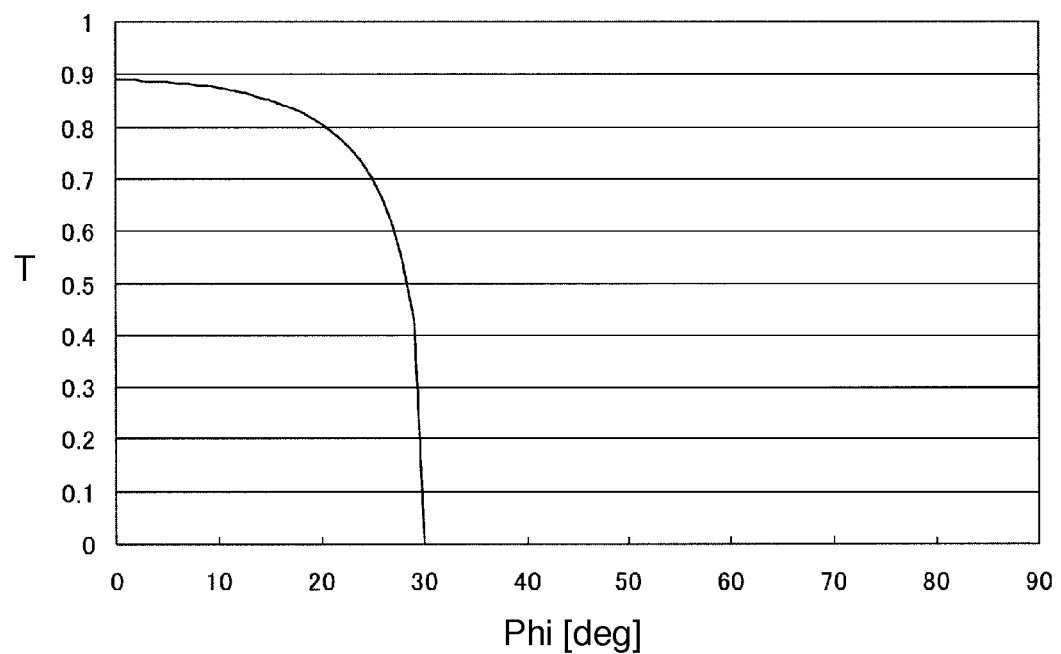
FIG. 5 shows a simulation result of a transmission spectrum with regard to light having wavelength from 400 nm to 800 nm.

FIG. 5 shows a graph of averages of transmission rates (T) from 400 nm to 800 nm wavelengths, each of the averages corresponding to each incident angle (Phi).

As shown in FIG. 5, since the refraction index of zinc oxide (n=2) is greater than that of air (n=1), transmission rates steeply falls and total reflection occurs in cases that incident angles were greater than Brewster's angle. Therefore, in the case that Phi is equal to or greater than 30 degrees, light cannot be extracted from the zinc oxide layer to outside.

EXAMPLE 1

Figure 6A:
FIG. 6A shows a cross-sectional view of a column-shaped structural body of a wavelength conversion element according to Example 1.
Figure 6B:
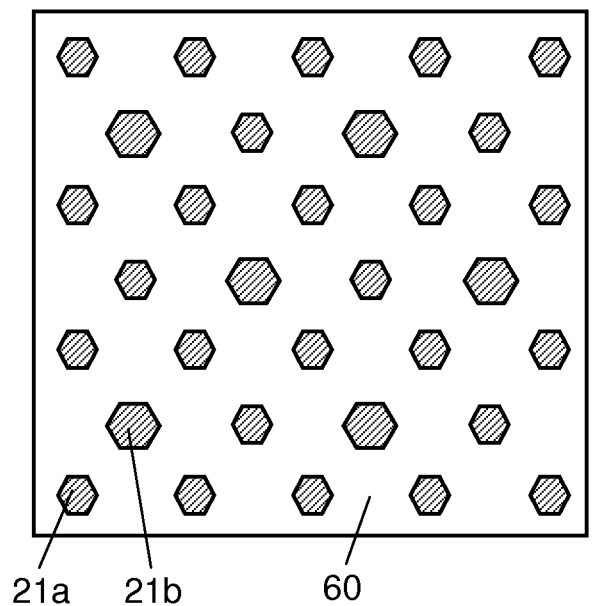
FIG. 6B shows a top view of a column-shaped structural body of a wavelength conversion element according to Example 1.

FIG. 6A shows a cross-sectional view of a column-shaped structural body of a wavelength conversion element according to Example 1. FIG. 6B shows a top view of the column-shaped structural body. In a simulation by using RCWA method, a thickness of zinc oxide layer 60 is set to be 0.15 μm, and a light source is arranged on a normal line going through a center of a main surface of the zinc oxide layer 60. Column-shaped structural body of zinc oxide columnar crystals is set to have two kinds of heights and thicknesses. Two kinds of column-shaped bodies were arranged alternatively and hexagonally. In other words, adjacent three column-shaped bodies are located at vertexes of an equilateral triangle. A distance between center axes of two adjacent column-shaped bodies is set to be 0.6 μm. The two different heights of the column-shaped bodies are set to be 0.65 μm and 0.55 μm. The two different thicknesses of the column-shaped bodies are set to be 0.3 μm and 0.6 μm. As described in Embodiment 1, a thickness of a column-shaped body means a diameter of a circle circumscribing a cross-sectional shape of the column-shaped body, the cross-sectional shape being vertical to a longitudinal direction of the column-shaped body. Transmission rates of light from the zinc oxide layer to an interface between the zinc oxide and air are calculated by using RCWA method. The calculation was performed for cases in which incident angles (Phi) ranges from 0 degree to 89 degrees. In each of the cases, a wavelength of the light is changed from 400 nm to 800 nm by 1 nm steps.

Figure 7:
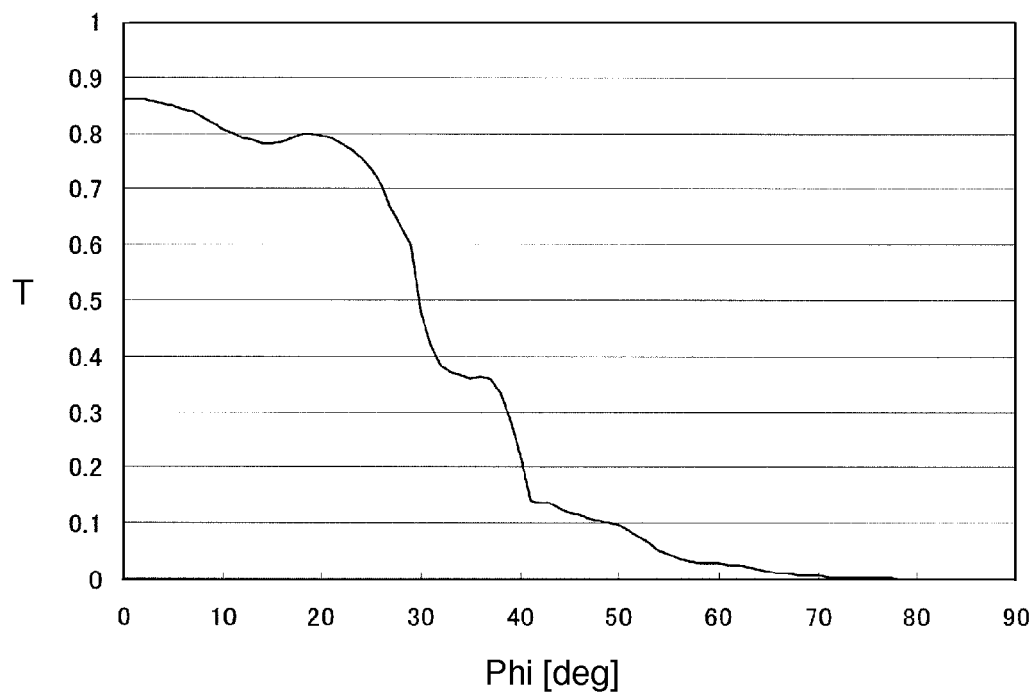
FIG. 7 is a graph showing averages of transmission rates from 400 nm to 800 nm wavelengths, each of the averages corresponding to each incident angle in Example 1.

FIG. 7 is a graph showing averages of transmission rates from 400 nm to 800 nm wavelengths, each of the averages corresponding to each incident angle.

As shown in FIG. 7, transmitted light exists from incident angle of 0 degree to around 70 degrees to the interface. Thus, light extraction efficiency is improved in comparison to the comparative example including only the zinc oxide layer

EXAMPLE 2

In Examples 2, different from Example 1, a distance between center axes of two adjacent column-shaped bodies is set to be 0.7 μm, and thicknesses of column-shaped bodies are set to be 0.35 μm and 0.91 μm. The other constructions of Example 2 are the same as those of Example 1. Transmission rates of light from the zinc oxide layer to an interface between the zinc oxide and air are calculated by using the RCWA method. The calculation was performed for cases in which incident angles (Phi) ranges from 0 degree to 89 degrees. In each of the cases, a wavelength of the light is changed from 400 nm to 800 nm by 1 nm steps.

Figure 8:
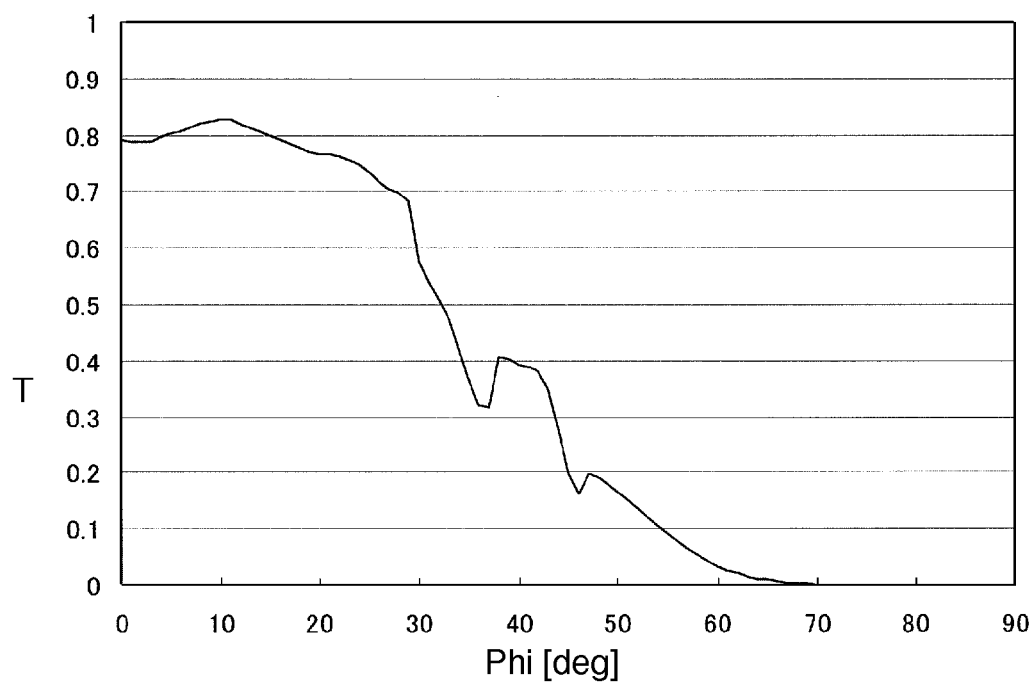
FIG. 8 is a graph showing averages of transmission rates from 400 nm to 800 nm wavelengths, each of the averages corresponding to each incident angle in Example 2.

FIG. 8 is a graph showing averages of transmission rates from 400 nm to 800 nm wavelengths, each of the averages corresponding to each incident angle.

As shown in FIG. 8, transmitted light existed from 0 degree to around 70 degrees to the interface, and moreover, transmission rates from around 40 degrees to around 60 degrees become better than those of Example 1.

EXAMPLE 3

Figure 9:
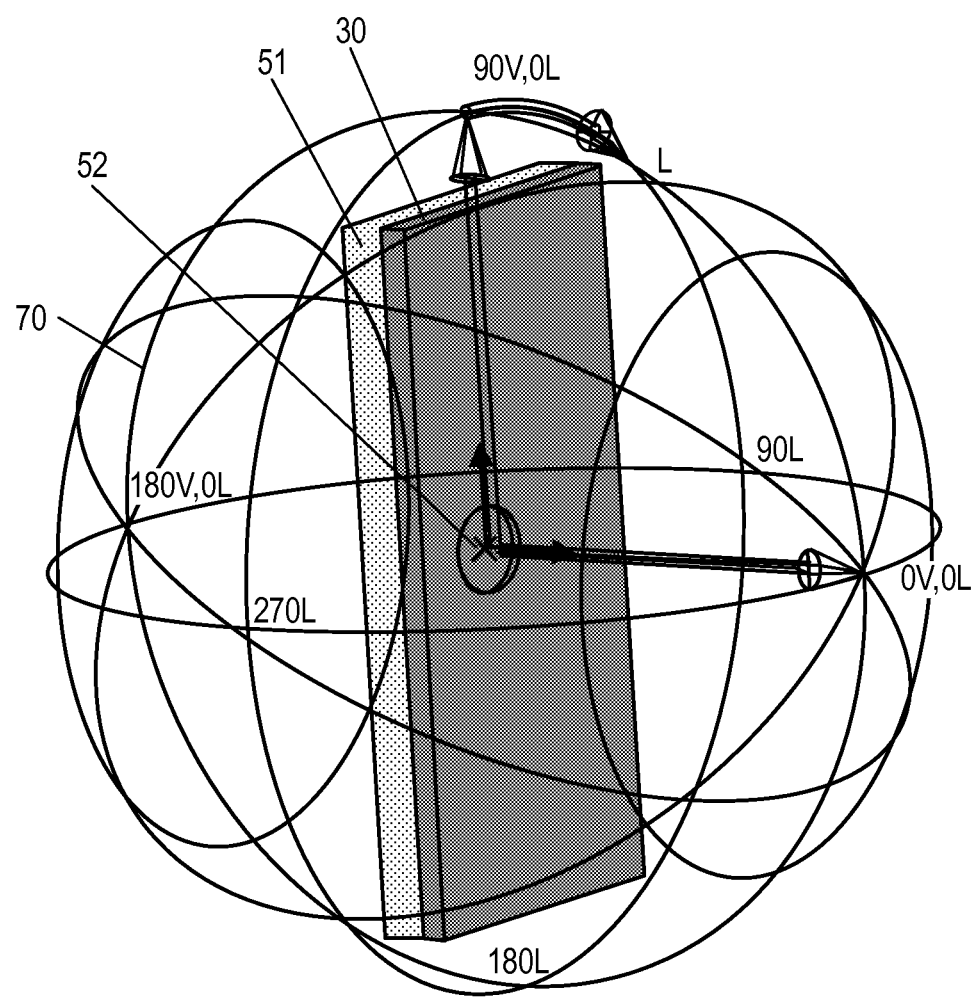
FIG. 9 shows a three dimensional model of a light emitting device used in a ray tracing simulation of Light Tools.

FIG. 9 shows a three dimensional model of a light emitting device used in a ray tracing simulation of Light Tools.

Package 51 was set to support LED chip 52. Wavelength conversion element 30 was provided on package 51. Far-field photo-detector 70 was provided to detect light emitted from the light emitting device.

In the light emitting device, package 51 has the following dimensions: a width W=5.6 mm; a depth D=2.8 mm; and a height H=0.34 mm. The internal dimensions of package 51 are these; a width W=5.2 mm; a depth D=2.4 mm; and a height H=0.24 mm. The external dimensions of LED chip 52 are these: a width W=0.6 mm; a depth D=0.6 mm; and a height H=0.1 mm. A thickness of substrate 11 is set to be 0.45 mm. A thickness of phosphor layer 10 is set to be 24 μm. Phosphors are set to be YAG:Ce having 3 μm particle diameter. A weight of phosphors par unit area is set to be 3.3 mg/cm².

A light source is provided in LED chip 52 made of gallium nitride. LED chip 52 is arranged on a center of a bottom part of package 51 made of $TiO_2$ having a cup shape. $TiO_2$ is selected as a material for package 51 considering scattering refraction on an inside surface of package 51.

Figure 10A:
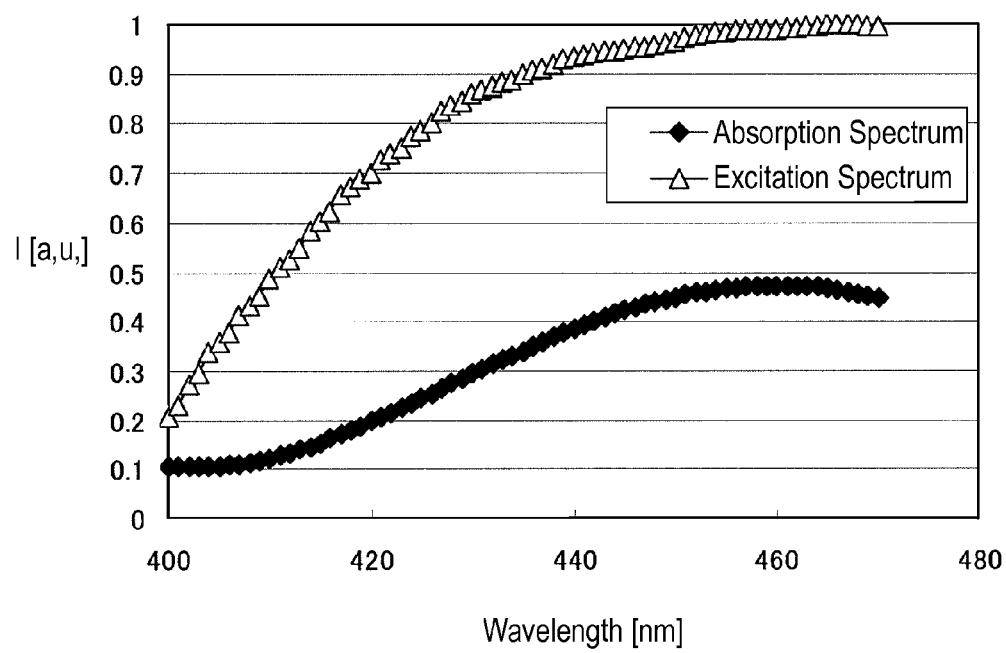
FIG. 10A shows absorption and excitation spectra of YAG:Ce phosphor used in a simulation.
Figure 10B:
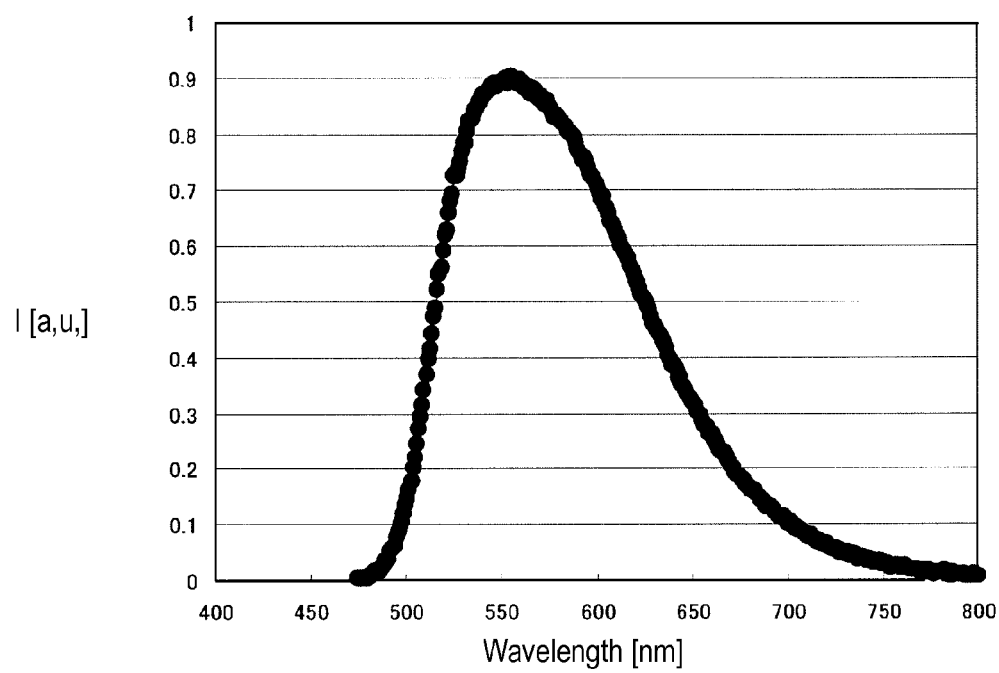
FIG. 10B shows a light emission spectrum of YAG:Ce phosphor used in a simulation.

FIG. 10A shows absorption and excitation spectra of YAG:Ce phosphor used in a simulation. FIG. 10B shows a light emission spectrum of YAG:Ce phosphor used in the simulation.

Accumulated light intensity and spectrum of whole light entered into far-field photo-detector 70 of LightTools are used as light emission intensity and spectrum of light emitted from the light emitting device.

Figure 11A:
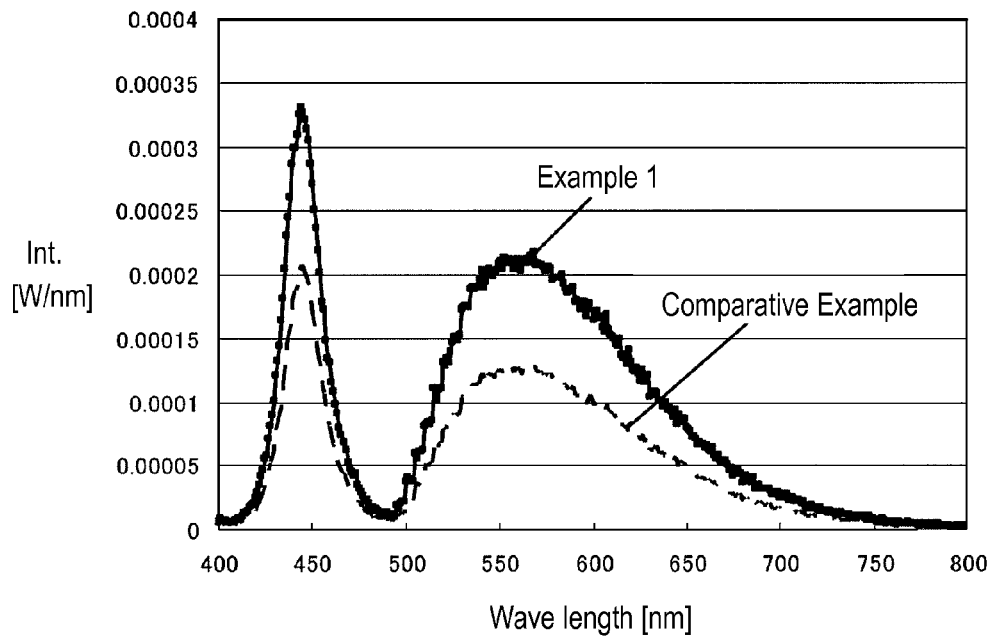
FIG. 11A shows light emission spectra of a comparative example and a light emitting device using a wavelength conversion element of Example 1.
Figure 11B:
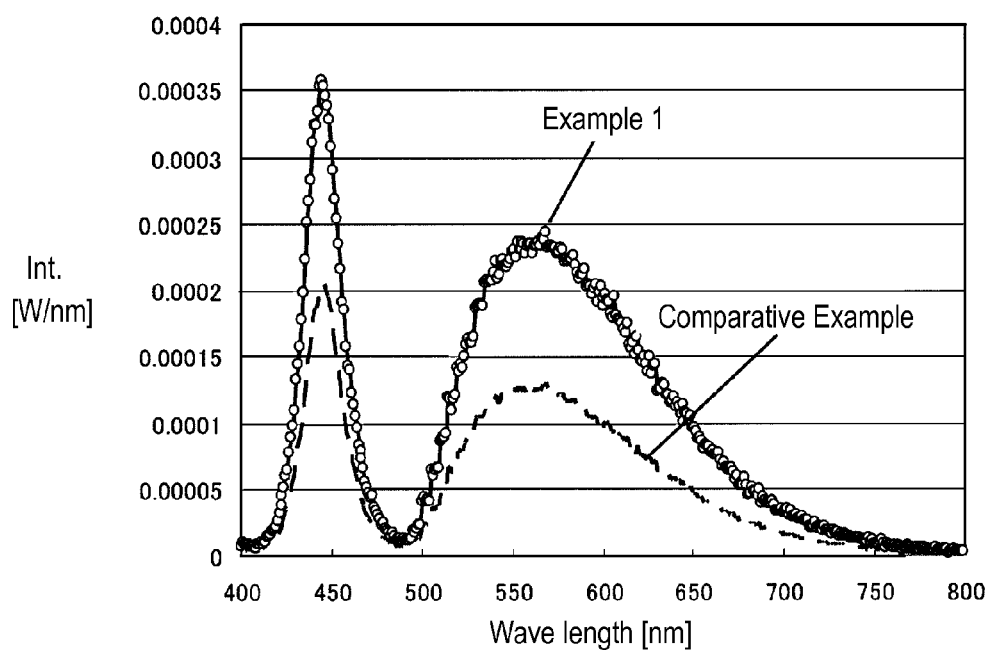
FIG. 11B shows light emission spectra of a comparative example and a light emitting device using a wavelength conversion element of Example 2.

FIG. 11A shows light emission spectra of a comparative example and a light emitting device using a wavelength conversion element of Example 1. FIG. 11B shows light emission spectra of the comparative example and a light emitting device using a wavelength conversion element of Example 2.

As shown in FIGS. 11A and 11B, light extraction can be improved in a broad spectrum area from 420 nm to 750 nm by using the wavelength conversion element of Embodiment 1. In other words, light extraction can be improved in a broad spectrum area from 420 nm to 750 nm by setting a distance between center axes of two adjacent column-shaped bodies to be from 420 nm to 750 nm.

Table 1 comparatively shows light emission intensities in cases using a wavelength conversion element of a comparative example and wavelength conversion elements of Example 1. Heights of first and second column-shaped bodies of column-shaped structural bodies are indicated as H1 and H2.

TABLE 1

| Height H1/H2 (µm) | Relative Light Emission Intensity |
|---|---|
| 0/0 (Comparative Example) | 100% |
| 0.6/0.6 | 146% |
| 0.15/0.05 | 120% |
| 0.25/0.15 | 163% |
| 0.35/0.25 | 162% |
| 0.45/0.35 | 170% |
| 0.55/0.45 | 169% |
| 0.65/0.55 | 165% |
| 0.75/0.65 | 160% |
| 0.85/0.75 | 156% |
| 0.95/0.85 | 155% |

The light emission intensities are relatively compared, in which the light emission intensity of the wavelength conversion element of the comparative example including no column-shaped structural body is set to be 100.

As shown in Table 1, in the case that both heights of first and second column-shaped bodies of a column-shaped structural body are set to be 0.6 µm (0.6/0.6), optical output increased so that light emission intensity is 146, while that of the comparative example is 100 (0/0). Light emission intensity further increased in the case that thickness of first column-shaped bodies is set to be 0.3 µm; thickness of second column-shaped bodies is set to be 0.6 µm; and a height difference between the first column-shaped bodies and the second column-shaped bodies is set to be 0.1 µm (0.25/0.15).

Moreover, light emission intensity is improved to be 169 or more in the case that a height ratio of first column-shaped bodies vs. second column-shaped bodies is from 0.45 µm:0.35 µm vs. 0.55 µm:0.45 µm. In the case that a height difference between first column-shaped bodies and second column-shaped bodies is set to be 0.1 µm and a height of the second column-shaped bodies is set to be 0.05 µm (0.15/0.05), relative light emission intensity is lower than that in the case (0.6/0.6). Thus, heights of column-shaped bodies can be more than 0.05 µm (50 nm) to improve light extraction efficiency.

Table 2 comparatively shows light emission intensities in cases using a wavelength conversion element of a comparative example and wavelength conversion elements of Example 2. Heights of two kinds of columns in two-dimensional periodic structure are indicated as H1 and H2.

TABLE 2

| Height H1/H2 (µm) | Relative Light Emission Intensity |
|---|---|
| 0/0 (Comparative Example) | 100% |
| 0.15/0.05 | 127% |
| 0.25/0.15 | 192% |
| 0.35/0.25 | 192% |
| 0.45/0.35 | 192% |
| 0.55/0.45 | 191% |
| 0.65/0.55 | 187% |
| 0.75/0.65 | 183% |
| 0.85/0.75 | 181% |
| 0.95/0.85 | 182% |

The light emission intensities are relatively compared, in which the light emission intensity of the wavelength conversion element of the comparative example including no column-shaped structural body is set to be 100.

As shown in Table 2, light emission intensity further increased in the case that thickness of first column-shaped bodies is set to be 0.35 µm; thickness of second column-shaped bodies is set to be 0.91 µm; and a height difference between the first column-shaped bodies and the second column-shaped bodies is set to be 0.1 µm (0.25/0.15).

Moreover, light emission intensity is improved up to 192 in the case that a height ratio of first column-shaped bodies vs. second column-shaped bodies is from 0.25 µm:0.15 µm to 0.55 µm:0.45 µm. Thus heights of column-shaped bodies can be more than 0.15 µm.

EXAMPLE 4

In order to examine a relationship between arrangement intervals of column-shaped bodies in column-shaped structural bodies and light extraction efficiency, relative light emission intensities are calculated by changing the arrangement intervals of the column-shaped bodies in the column-shaped structural bodies. Heights H1 and H2 of first and second column-shaped bodies are set to be 0.45 µm and 0.35 µm.

Table 3 comparatively shows light emission intensities in cases using a wavelength conversion element of a comparative example and wavelength conversion elements of Example 4.

TABLE 3

| Arrangement Interval | Height H1/H2 (µm) | Relative Light Emission Intensity |
|---|---|---|
| Comparative Example | 0/0 | 100% |
| 0.4 | 0.45/0.35 | 154% |
| 0.5 | 0.45/0.35 | 168% |
| 0.6 | 0.45/0.35 | 170% |
| 0.7 | 0.45/0.35 | 192% |
| 0.8 | 0.45/0.35 | 184% |
| 0.9 | 0.45/0.35 | 178% |

As shown in Table 3, in the case that arrangement intervals are within a range from 0.4 µm to 0.9 µm both inclusive, relative light emission intensities are 154% or more. Thus, this range of the arrangement intervals allows light extraction efficiency to be improved significantly.

EXAMPLE 5

In order to examine a relationship between light extraction efficiency and ratios of arrangement intervals vs. heights of column-shaped bodies in column-shaped structural bodies, relative light emission intensities are calculated by changing the heights and arrangement intervals of the column-shaped bodies in the column-shaped structural bodies.

Table 4 comparatively shows light emission intensities in cases using a wavelength conversion element of a comparative example and wavelength conversion elements of Example 5.

TABLE 4

| | Relative Light Emission Intensity | |
|---|---|---|
| Height H1/H2 (µm) | Arrangement Interval: 0.6 µm | Arrangement Interval: 0.7 µm |
| 0/0 (Comparative Example) | 100% | 100% |
| 0.4/0.4 | 166% | 189% |

TABLE 4-continued

| | Relative Light Emission Intensity | |
|---|---|---|
| Height H1/H2 (μm) | Arrangement Interval: 0.6 μm | Arrangement Interval: 0.7 μm |
| 0.425/0.375 | 199% | 190% |
| 0.45/0.35 | 170% | 192% |
| 0.475/0.325 | 201% | 192% |
| 0.5/0.3 | 50% | 166% |

As shown in Table 4, in the case that both heights of first and second column-shaped bodies are set to be 0.4 μm (0.4/0.4), light emission intensities are 166% (when arrangement intervals are 0.6 μm) and 189% (when arrangement intervals are 0.7 μm). Thus, with both the arrangement intervals, relative light emission intensities are higher than those of the comparative example (0/0). Furthermore, in the case that height differences are within a range from 0.05 μm to 0.15 μm both inclusive, relative light emission intensities are over 170 with both the arrangement intervals of 0.6 μm and 0.7 μm. Thus, light extraction efficiencies are significantly improved.

On the other hand, in the case that a height difference of first and second column-shaped bodies is 0.2 μm (0.5/0.3), a relative light emission intensity is dropped with the arrangement intervals of 0.6 μm. However, it is understood that depending on a wavelength of an incident light, a relative light emission intensity can be higher than that of the comparative example even when the height difference of first and second column-shaped bodies is 0.2 μm. In the case that an arrangement interval is 0.7 μm, a relative light emission intensity is 166%.

According to those results, it is understood that light extraction efficiency of a wavelength conversion element is improved by setting a height difference of first and second column-shaped bodies to be in a range from 0.05 μm to 0.15 μm both inclusive, and setting arrangement intervals at least from 0.6 μm to 0.7 μm both inclusive.

Furthermore, according to those optical simulation results, it is understood that a light extraction is improved in a broad spectrum area, and a light emission intensity of a light emitting device is improved because a column-shaped structural body is made of column-shaped bodies of different heights. Moreover, with regard to light emitting devices (e.g. white LED lumps) capable of emitting light of whole visible light region, it is possible to improve optical output without causing a color shift.

According to the embodiments and examples described above, a column-shaped structural body may comprise first and second column-shaped bodies having different heights. However, the column-shaped structural body may comprise column-shaped bodies having three different heights. In this case, the column-shaped structural body can improve light extraction in a broader wavelength range or the light can be extracted more evenly in a given wavelength range. As described in Embodiment 1, it is possible to form a column-shaped structural body including column-shaped bodies having three different heights by using a resist pattern having three kinds of openings of different sizes when forming the column-shaped bodies on a phosphor layer in chemical bath deposition.

The wavelength conversion element and the light emitting device disclosed in the present application can be used for back lights, head lights, lighting apparatuses or displays. While the present disclosure has been described with respect to preferred embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A wavelength conversion element comprising:
a phosphor layer including phosphor particles configured to be excited by light from a light source, and a matrix located among the phosphor particles; and
a column-shaped structural body including at least two kinds of column-shaped bodies having differences in at least one selected from the group consisting of height and thickness, periodically arranged, and in contact with the phosphor layer,
wherein the column-shaped bodies are a photonic crystal.

2. The wavelength conversion element of claim 1, wherein a distance between center axes of adjacent two of the column-shaped bodies is equal to or longer than a shortest wavelength of an incident light from the phosphor layer to the column-shaped structural body, and equal to or shorter than a longest wavelength of the incident light from the phosphor layer to the column-shaped structural body.

3. The wavelength conversion element of claim 1, wherein a distance between center axes of adjacent two of the column-shaped bodies is equal to or more than 420 nm, and equal to or less than 750 nm.

4. The wavelength conversion element of claim 1, wherein heights of the column-shaped bodies are equal to or shorter than a longest wavelength of an incident light from the phosphor layer to the column-shaped structural body.

5. The wavelength conversion element of claim 1, wherein diameters of circles circumscribing cross-sectional shapes of the column-shaped bodies are equal to or more than 0.25 μm, and equal to or less than 0.9 μm, wherein the cross-sectional shapes are vertical to a longitudinal direction of the column-shaped bodies.

6. The wavelength conversion element of claim 1, wherein the column-shaped bodies include at least first column-shaped bodies having a first thickness and second column-shaped bodies having a second thickness that is thicker than the first thickness.

7. The wavelength conversion element of claim 6, wherein the first column-shaped bodies are taller than the second column-shaped bodies.

8. The wavelength conversion element of claim 7, wherein a height difference between the first column-shaped bodies and the second column-shaped bodies is equal to or more than 50 nm, and equal to or less than 150 nm.

9. The wavelength conversion element of claim 7, wherein a height of the first column-shaped bodies is equal to or more than 150 nm, and equal to or less than 750 nm, and a height of the second column-shaped bodies is equal to or more than 50 nm, and equal to or less than 650 nm.

10. The wavelength conversion element of claim 7, wherein a diameter of circles circumscribing cross-sectional shapes of the first column-shaped bodies are equal to or more than 0.25 μm, and equal to or less than 0.35 μm, and a diameter of circles circumscribing cross-sectional shapes of the second column-shaped bodies are equal to or more than 0.5 μm, and equal to or less than 0.9 μm, wherein the cross-sectional shapes of the first and second column-shaped bodies are vertical to a longitudinal direction of the column-shaped bodies.

11. The wavelength conversion element of claim 7, wherein the column-shaped bodies are located at vertexes of triangles on a plane, and the first column-shaped bodies and the second column-shaped bodies are arranged alternately each other.

12. The wavelength conversion element of claim 1, wherein the column-shaped bodies are hexagonal columns.

13. The wavelength conversion element of claim 1, wherein arrangement intervals of the column-shaped bodies that are periodically arranged are equal to or more than 400 nm, and equal to or less than 900 nm.

14. The wavelength conversion element of claim 1, wherein the column-shaped bodies include at least one selected from a group of ceramics, inorganic crystal, resin and glass that are transparent at least in a visible light region.

15. The wavelength conversion element of claim 1, wherein the column-shaped bodies are made of a zinc oxide crystal.

16. The wavelength conversion element of claim 1, wherein an average of light extraction efficiency in a wavelength band from 400 nm to 750 nm both inclusive is higher than light extraction efficiency in other wavelength bands when light enters from the phosphor layer and exits from the column-shaped structural body.

17. The wavelength conversion element of claim 1, wherein the matrix is formed of zinc oxide that is crystallized and c-axis oriented.

18. The wavelength conversion element of claim 17, wherein a longitudinal direction of the column-shaped bodies is parallel to a c-axis of the zinc oxide that forms the matrix.

19. A light emitting device comprising:
the light source configured to emit an excitation light; and
the wavelength conversion element of claim 1, wherein the wavelength conversion element is configured to receive the excitation light emitted from the light source.

20. A vehicle comprising: the light emitting device of claim 19; and a power source configured to supply power to the light emitting device.

21. The wavelength conversion element of claim 1, wherein the phosphor layer is arranged between the column-shaped structural body and the light source in a normal line direction of a main surface of the phosphor layer.

22. The wavelength conversion element of claim 1, wherein the phosphor layer and the column-shaped structural body are arranged such that said light travels from the phosphor layer to the column-shaped structural body.

23. The wavelength conversion element of claim 1, wherein the column-shaped structural body is located on a surface different from a surface where said light enters.

* * * * *